(12) United States Patent
Uhm et al.

(10) Patent No.: US 9,442,338 B2
(45) Date of Patent: Sep. 13, 2016

(54) TRANSPARENT DISPLAY DEVICE AND METHOD OF MANUFACTURING THE SAME

(71) Applicant: LG Display Co., Ltd., Seoul (KR)

(72) Inventors: Seong-Yong Uhm, Gyeonggi-do (KR);
Jin-Wuk Kim, Gyeonggi-do (KR);
Hwa-Youl Lee, Gyeonggi-do (KR);
June-Hwan Kim, Seoul (KR);
Seok-Ho Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 259 days.

(21) Appl. No.: 14/086,015

(22) Filed: Nov. 21, 2013

(65) Prior Publication Data
US 2014/0320782 A1 Oct. 30, 2014

(30) Foreign Application Priority Data
Apr. 25, 2013 (KR) .................. 10-2013-0046371

(51) Int. Cl.
| | |
|---|---|
| G02F 1/1335 | (2006.01) |
| G02F 1/155 | (2006.01) |
| G02F 1/1334 | (2006.01) |
| G02F 1/15 | (2006.01) |
| H01L 27/32 | (2006.01) |
| F21V 8/00 | (2006.01) |

(52) U.S. Cl.
CPC ............ G02F 1/155 (2013.01); G02F 1/1334 (2013.01); G02F 1/133528 (2013.01); G02F 1/133603 (2013.01); G02F 1/1521 (2013.01); G02F 1/1525 (2013.01); H01L 27/3232 (2013.01); G02B 6/0055 (2013.01); G02B 6/0056 (2013.01); G02F 2201/44 (2013.01); G02F 2202/36 (2013.01)

(58) Field of Classification Search
CPC ..................... G02B 27/2214; G02F 1/133512
USPC .......................................................... 349/15
See application file for complete search history.

(56) References Cited

U.S. PATENT DOCUMENTS

| | | | |
|---|---|---|---|
| 2007/0138941 A1 | 6/2007 | Jin et al. | |
| 2008/0278792 A1 | 11/2008 | Jang et al. | |
| 2013/0021561 A1* | 1/2013 | Ahn | G02F 1/133512 349/77 |

FOREIGN PATENT DOCUMENTS

| | | |
|---|---|---|
| CN | 1988169 A | 6/2007 |
| CN | 101303503 A | 11/2008 |
| KR | 10-2012-0106432 A | 9/2012 |

OTHER PUBLICATIONS

Office Action dated Apr. 29, 2016, issued by the State Intellectual Property Office of China in Chinese Application No. 201310751118.3.

* cited by examiner

*Primary Examiner* — Thanh-Nhan P Nguyen
(74) *Attorney, Agent, or Firm* — Morgan, Lewis & Bockius LLP

(57) ABSTRACT

A transparent display device and a method of manufacturing the same are provided. The transparent display device includes: a display panel unit including: a first side configured to display an image, and a second side opposed to the first side, and a variable blocking film at the second side of the display panel unit, the variable blocking film including electrochromic core-shell nanoparticles.

18 Claims, 9 Drawing Sheets

TRANSPARENT DISPLAY DEVICE AND METHOD OF MANUFACTURING THE SAME

CROSS-REFERENCE TO RELATED APPLICATION(S)

This application claims the benefit under 35 U.S.C. §119(a) of Korean Patent Application No. 10-2013-0046371, filed on Apr. 25, 2013, in the Korean Intellectual Property Office, the entire disclosure of which is incorporated by reference herein for all purposes.

BACKGROUND

1. Technical Field

The following description relates to a display device and method of manufacturing the same, and more particularly, to a transparent display device having a transmission mode and an image-display mode.

2. Discussion of the Related Art

With rapid development of information technologies, display devices for displaying a large amount of information have been promptly developed. More particularly, various flat panel display (FPD) devices have been introduced and spotlighted.

The flat panel display devices include, for example liquid crystal display (LCD) devices, plasma display panel (PDP) devices, field emission display (FED) devices, electroluminescence display (ELD) devices, and organic electroluminescent display (OLED) devices. The flat panel display devices generally have a thin profile, light weight and low power consumption and have been rapidly replacing cathode ray tube (CRT).

Meanwhile, transparent display devices, which display images or through which users see objects opposite (through) the device, have been actively researched and developed in recent. The transparent display devices have advantages of better use of space, interior designs, and other applications.

However, the transparent display devices generally need both to clearly transmit objects opposite (through) the device, and to distinctly display images.

SUMMARY

Accordingly, embodiments of the present application are directed to a transparent display device and a method of manufacturing the same that substantially obviates one or more problems due to the limitations and disadvantages of the related art An object of embodiments is to provide a transparent display device that provides more vivid images and improves display qualities and reliability.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided a transparent display device, including: a display panel unit including: a first side configured to display an image, and a second side opposed to the first side, and a variable blocking film at the second side of the display panel unit, the variable blocking film including electrochromic core-shell nanoparticles.

In another aspect, there is provided a method of manufacturing a transparent display device, including: providing a display panel unit including: a first side configured to display an image, and a second side opposed to the first side, and providing a variable blocking film at the second side of the display panel unit, the variable blocking film including electrochromic core-shell nanoparticles.

It is to be understood that both the foregoing general description and the following detailed description are examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
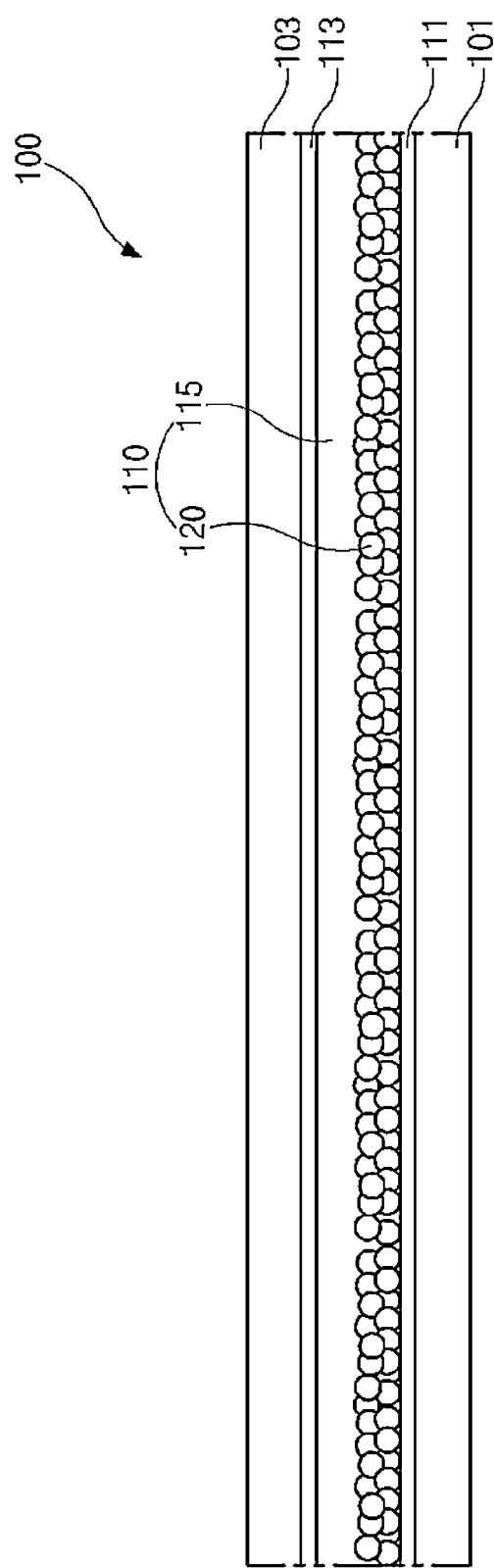
FIG. 1 is a cross-sectional view of schematically illustrating a variable blocking film according to an embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

Figure 2A:
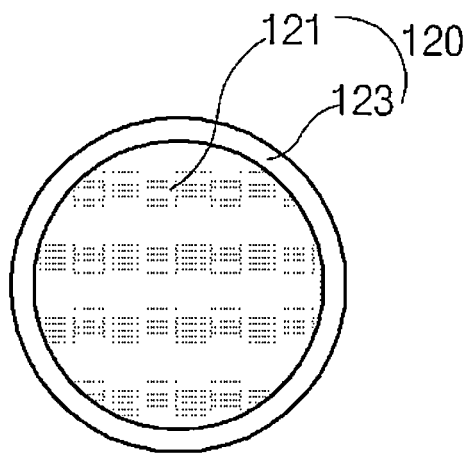
FIGS. 2A and 2B are schematic views of a core-shell nanoparticle in ON and OFF states.
Figure 2B:
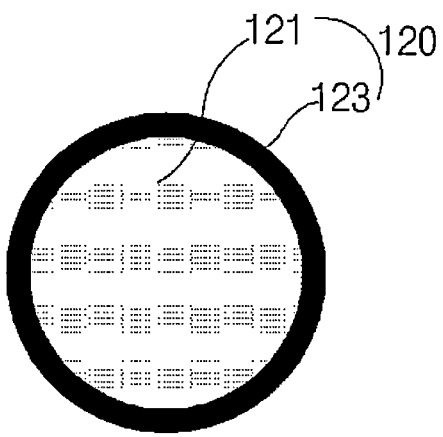

FIG. 1 is a cross-sectional view of a variable blocking film according to an embodiment. FIGS. 2A and 2B are schematic views of a core-shell nanoparticle in ON and OFF states.

In FIG. 1, the variable blocking film 100 according to an embodiment may include lower and upper transparent films 101 and 103, lower and upper transparent electrodes 111 and 113 on respective inner surfaces of the lower and upper transparent films 101 and 103, and an electrochromic layer 110 interposed between the lower and upper transparent electrodes 111 and 113.

Each of the lower and upper transparent electrodes 111 and 113 may include a transparent conductive material, such as indium tin oxide (ITO), antimony tin oxide (ATO), indium zinc oxide and/or other transparent conductive polymer materials, and may have a thickness of several thousand angstroms (Å).

The electrochromic layer 110 may include electrolyte 115 and core-shell nanoparticles 120. The core-shell nanoparticles 120 may be widely dispersed in the electrolyte 115, such that ions may move when electrochromism of the core-shell nanoparticles 120 occurs. For example, a color of each core-shell nanoparticle 120 may be changed by an electrical oxidation-reduction reaction from applied voltages, and a transmissive property of the core-shell nanoparticle 120 may be altered.

For example, the variable blocking film 100 of an embodiment may transmit or absorb and block light by turning the core-shell nanoparticle 120 transparent or black depending on the applied voltages to the lower and upper transparent electrodes 111 and 113.

With reference to FIGS. 2A and 2B, each core-shell nanoparticle 120 in the electrochromic layer 110 may include a core 121 and a shell 123. The core 121 may have a high transmittance (e.g., may be transparent), and the shell 123, which may transmit or block light according to electrical signals, may surround the core 121.

An oxidation-reduction reaction may be caused by ions or electrons according to voltages applied to the shell 123, and the core-shell nanoparticle 120 may reversibly change its color.

That is, the shell 123 of the core-shell nanoparticle 120 may include a material that may be turned from transparent to black or from black to transparent, and the core-shell nanoparticle 120 may have a light-blocking property and a light-transmitting property.

As shown in the FIG. 2A example, in an OFF state in which voltages may not be applied to the lower and upper transparent electrodes 111 and 113, the core 121 and the shell 123 of the core-shell nanoparticle 120 may be transparent. As shown in the FIG. 2B example, in an ON state in which voltages may be applied to the lower and upper transparent electrodes 111 and 113, the shell 123 of the core-shell nanoparticle 120 may turn black.

The core 121 may be formed of a transparent conductive material, such that electrons from electrodes may be injected well thereinto and a response time of the core-shell nanoparticle 120 may increase. The transparent conductive material may include, for example, indium tin oxide (ITO) and/or indium zinc oxide (IZO).

The core 121 may have a nanocrystal size of, e.g., about 3 nm to about 10 nm, and the nanoparticle 120 may have a nanocrystal size of, e.g., about 10 nm to about 300 nm.

The shell 123 may have a structure of the following chemical formula 1:

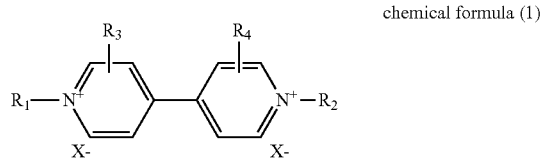

chemical formula (1)

For example, each of R1 and R2 may be, for example, hydrogen, halogen, sulfur-containing group, hydroxyl group, substituted or unsubstituted C1~C20 alkoxylene group, substituted or unsubstituted C1~C20 alkylene group, substituted or unsubstituted C2~C20 alkenylene group, substituted or unsubstituted C2~C20 alkynylene group, substituted or unsubstituted C3~C20 cycloalkylene group, substituted or unsubstituted C3~C20 cycloalkenylene group, substituted or unsubstituted C3~C20 cycloalkynylene group, substituted or unsubstituted C2~C20 heterocycloalkylene group, substituted or unsubstituted C2~C20 heterocycloalkenylene group, substituted or unsubstituted C2~C20 heterocycloalkynylene group, substituted or unsubstituted C6~C30 arylene group, substituted or unsubstituted C6~C30 oxyarylene group, substituted or unsubstituted C1~C20 alkyl group or C6~C30 aryl group, or substituted or unsubstituted C1~C20 alkyl group or C6~C30 aryl group.

Each of R3 and R4 may be, for example, hydrogen or substituted or unsubstituted C1~C5 alkyl group. X may be, for example, one of anions with a negative one charge such as Cl, Br, I, $PF_6$, TFSi, $BF_4$, $ClO_4$. When R1 is an alkyl group, the greater the number of carbons, the faster the response time of the core-shell nanoparticle 120 may be.

The shell 123 may have a color, depending on R2. In an example in which R2 includes a material that is tinged with black, the core 121 and the shell 123 of the core-shell nanoparticle 120 may be transparent when voltages are not applied, and the shell 123 may turn from transparent to black when voltages are applied.

If it is difficult to show black with a single color, the shell 123 of the core-shell nanoparticle 120 may be changed to have, for example, a combination of cyan, yellow, and magenta colors or a combination of red, green, and blue colors. Alternatively, the shells 123 of the core-shell nanoparticles 120 may have various colors, and black may be shown by mixture of the colors. For example, when R2 is bromobenzene, the color of the shell 123 may be changed into cyan or bluish green; when R2 is 4-chlorobenzonitrile, the color of the shell 123 may be changed into magenta or red; and when R2 is chlorosalicylic acid, the color of the shell 123 may be changed into yellow or green.

Figure 3:
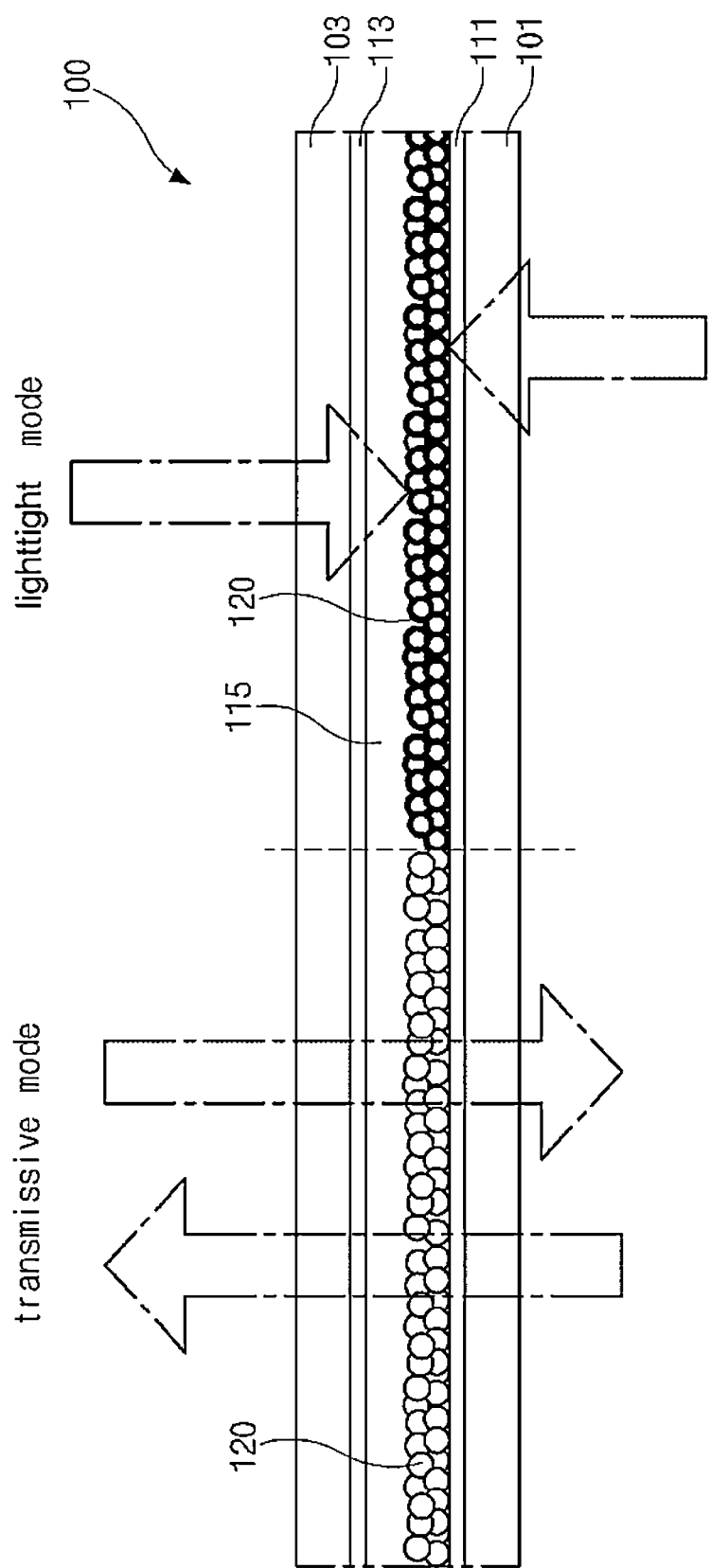
FIG. 3 is a cross-sectional view of a variable blocking film in a transmissive mode and a lighttight mode according to an embodiment.

FIG. 3 is a cross-sectional view of a variable blocking film in a transmissive mode and a lighttight mode according to an embodiment. In the transmissive mode, a user may view objects opposite (through) the device. In the lighttight mode (e.g., light blocking mode), transmission of light through the device may be limited, and an image may be displayed on the device.

As shown in FIG. 3, in response to voltages not being applied to the lower and upper transparent electrodes 111 and 113, the core-shell nanoparticles 120 of the electrochromic layer 110 may be transparent, and the variable blocking film 100 may operate in a transmissive mode transmitting light.

In contrast, in response to voltages being applied to the lower and upper transparent electrodes 111 and 113, the core-shell nanoparticles 120 of the electrochromic layer 110 may be tinged with black, and the variable blocking film 100 may operate in a lighttight mode blocking or reflecting light.

In the meantime, the electrolyte 115 (in which the core-shell nanoparticles 120 may be dispersed) may be a solid electrolyte, such that the variable blocking film 100 may have a flexible property, a total thickness of the variable blocking film 100 may be decreased, or adhesive properties of the lower and upper transparent films 101 and 103 may be increased.

In addition, the solid electrolyte may have relatively high ionic conductivity, high transparency, and a low haze property. Moreover, the solid electrolyte 115 may have a relatively high contact property with the lower and upper transparent films 101 and 103.

The electrolyte 115 may be a semisolid of a gel type. When the solid electrolyte is used as the electrolyte 115 in which the core-shell nanoparticles 120 are dispersed, an additional fixing material, such as a seal pattern for preventing leakage of the electrochromic layer 110, may be omitted in the variable blocking film 100.

Moreover, as the electrochromic layer 110 of the variable blocking film 100 may include the core-shell nanoparticles 120 of a sphere shape, the electrochromic layer 110 may have a large specific surface area in comparison with a flat shape, and light-blocking efficiency may be increased. The shells 123 of the examples in FIGS. 2A and 2B having a electrochromic property may not be materially adhered to the cores 121 of FIGS. 2A and 2B and may be chemically combined to the cores 121 of FIGS. 2A and 2B, and the electrochromic layer 110 may have high driving stability.

<Producing Core-Shell Nanoparticle Dispersion>

In experimental tests, indium tin oxide (ITO) dispersion was produced by putting indium tin oxide (30 g) having a first particle diameter of 15 nm, ethanol (50 g), and zirconia beads (120 g) having a size of 0.5 mm in 50 ml in a wide-mouth bottle and dispersing them using a paint shaker for about 5 hours.

In addition, a white material was obtained by putting 4,4-biprydine (15.6 g, 100 mmol), bromoethyl phosphonate (21.9 g, 100 mmol), and acetonitrile (100 g) in a 3-neck flask under a nitrogen condition and refluxing them at a temperature of about 60° C. for about 48 hours, by adding bromobenzene (8.5 g, 50 mmol), 4-chlorobenzonitrile (4.1 g, 30 mmol), chlorosalicylic acid (3.4 g, 20 mmol), and acetonitrile (100 g) and refluxing them at a temperature of about 45° C. for about 24 hours, by cleaning them with ethyl ether, and by recrystallizing them in a solution in which ethanol and ethyl ether of 2 to 1 are mixed.

Figure 4:
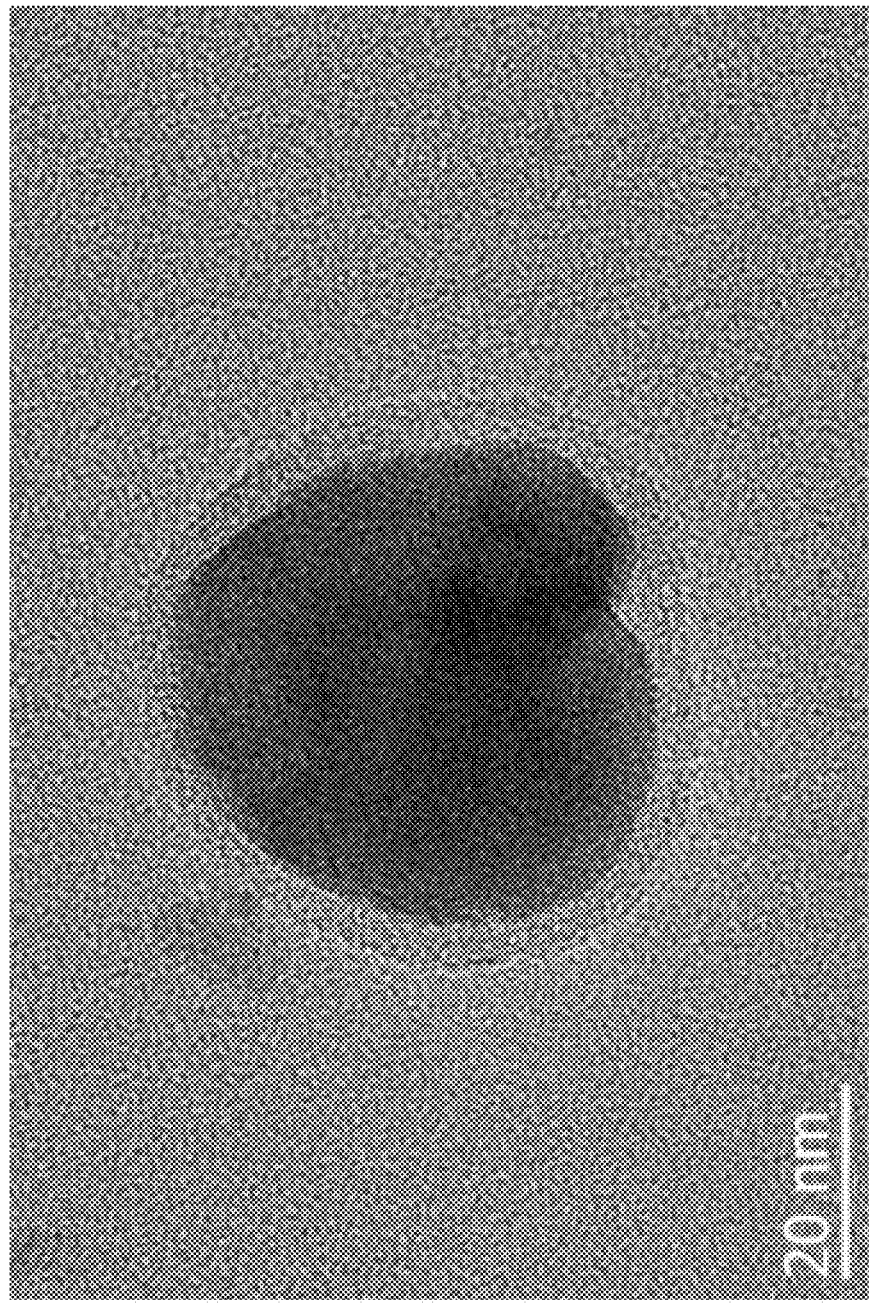
FIG. 4 is a photograph of a core-shell nanoparticle taken by a transmission electron microscope.

The white material (2.0 g) was dissolved in ethyl alcohol (100 g), mixed and stirred with the indium tin oxide dispersion (100 g) including 30 wt % of solids, refluxed and reacted by ultrasonic dispersion at a temperature of about 60° C. for about 12 hours, and cleaned to remove non-reactants. Therefore, as shown in the FIG. 4 example, a core-shell nanoparticle 120 was confirmed in an image taken by a transmission electron microscope.

The core-shell nanoparticle 120 may have a color, for example, of bluish green or green, yellow or yellowish green, or scarlet or red, depending on a ratio of elements of the shell 123 when voltages are applied.

<Producing a Solid Electrolyte>

In experimental tests, a transparent polymer solid electrolyte solution was produced by putting acetonitrile (300 g), polyethylene oxide (10.0 g) having a molecular weight of 600 K, urethane acrylate (10.0 g) with ethylene oxide (0.8 mol) and refluxing them for about 30 minutes and by adding LiTFSi (1.77 g) and S104 (0.5 g) of Air Products and Chemicals as an additive and refluxing them at a temperature of about 50° C. for about 6 hours.

The solution was applied and dried on electrodes spaced apart from each other with a distance of 1 mm therebetween, and ultraviolet (UV) light of 0.1 J/cm$^2$ was irradiated on the dried solution, thereby measuring impedance. Thus, it was confirmed that the solid electrolyte had an ionic conductivity of $1.6 \times 10^{-4}$ S/cm.

<Manufacturing a Variable Blocking Film>

In experimental tests, a core-shell nanoparticle dispersion layer was formed by applying the core-shell nanoparticle dispersion onto an ITO PET (indium tin oxide polyethylene terephthalate) film, which included a transparent film of PET and a transparent electrode of ITO, such that a final thickness of the applied core-shell nanoparticle dispersion was 2 micrometers (μm), and then drying the applied core-shell nanoparticle dispersion at a temperature of about 80° C. for about 30 minutes.

In addition, the solid electrolyte, which was dried and hardened, was applied on an ITO PET film such that the applied solid electrolyte had a thickness of about 10 micrometers (μm), dried at a temperature of about 80° C. for about 5 minutes, and hardened by an irradiating UV light of 0.1 J/cm$^2$.

The core-shell nanoparticle dispersion layer on the ITO PET film and the solid electrolyte on the ITO PET film were contacted with each other at a temperature of about 50° C. and laminated, thereby manufacturing the variable blocking film 100 of FIG. 1.

Table 1 shows transmittance and driving voltages of the variable blocking film measured by spectrophotometer DMS803 of Konica Minolta in a transmissive mode (OFF state) and a lighttight mode. The variable blocking film was aged 50 times with an interval of 10 seconds by applying +3.5V and −3.5V.

TABLE 1

|  | X | Y | transmittance | Voltage (V) |
| --- | --- | --- | --- | --- |
| Transmissive mode | 0.317 | 0.334 | 91.5% | 0, −2.8 |
| Lighttight mode | 0.370 | 0.377 | 3.7% | +3.4 |

With reference to Table 1, the variable blocking film according to an embodiment may be driven by relatively low voltages of about 3 V, and the transmittance in the transmissive mode may be about 91.5%, which may be considered as very high.

Moreover, the transmittance in the lighttight mode may be about 3.7%, and the variable blocking film may have a high light-blocking property.

Figure 5:
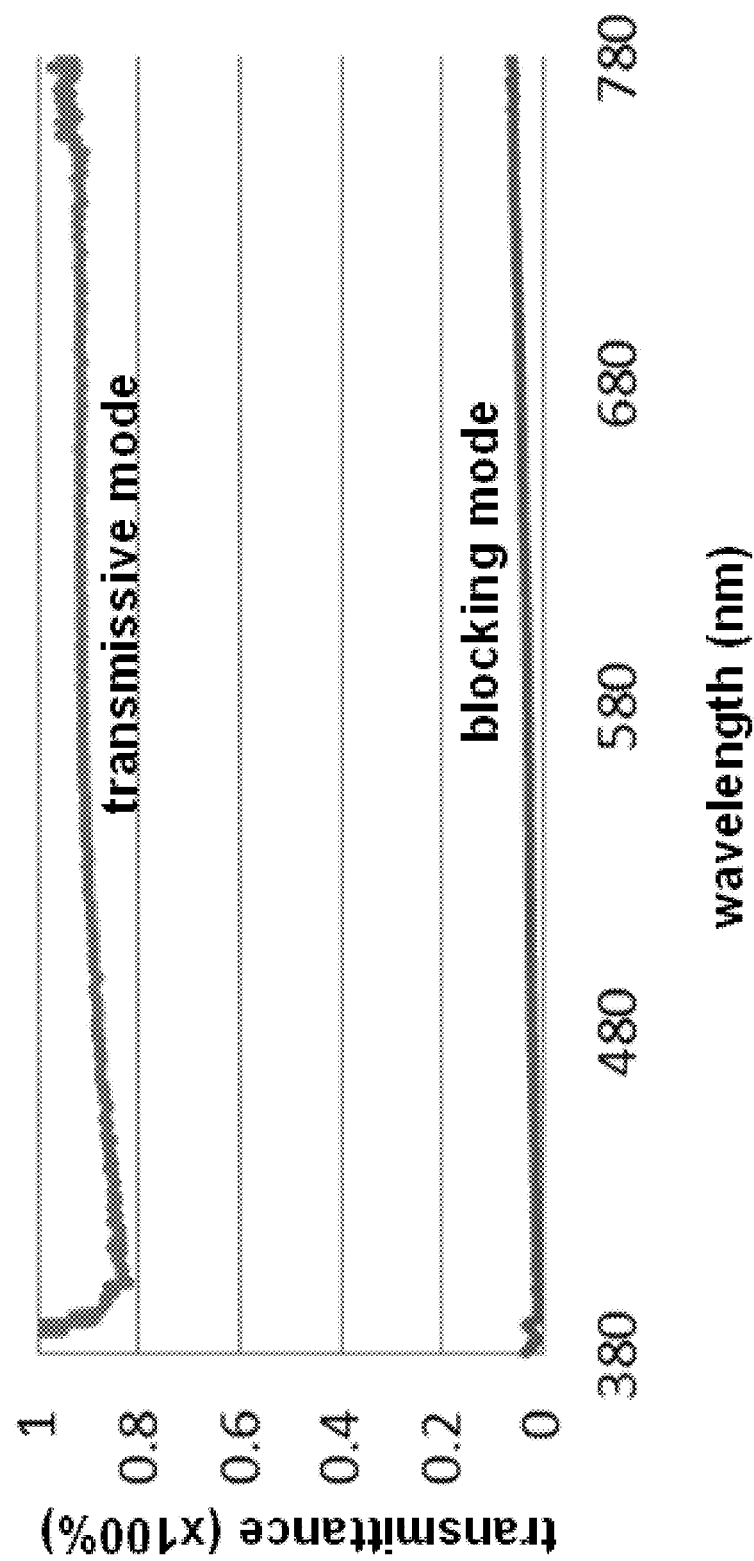
FIG. 5 is a graph illustrating experimental results of a transmittance spectrum of a variable blocking film according to an embodiment.

FIG. 5 shows experimental results of a transmittance spectrum of a variable blocking film according to an embodiment.

In FIG. 5, the variable blocking film 100 of the FIG. 3 example may have high transmittance with respect to all the wavelengths of visible light in a transmissive mode when voltages are not applied, and the variable blocking film may have low transmittance with respect to all the wavelengths of visible light in a lighttight mode when voltages are applied.

Therefore, the variable blocking film 100 of FIG. 3 may have high transmittance in the transmissive mode, and may have the high light-blocking property in the lighttight mode.

The variable blocking film 100 of the FIG. 3 example may be transparent by the core-shell nanoparticle 120 of FIG. 3, including the electrochromic shell 123 of FIG. 3, when voltages are not applied, and the variable blocking film 100 may transmit light. On the other hand, when voltages are applied, the shell 123 of FIG. 3 may become black, or colors of the shells 123 of FIG. 3 of several core-shell nanoparticles 120 of FIG. 3 may be mixed. The core-shell nanoparticles 120 of FIG. 3 may therefore block light. Accordingly, a transparent display device may selectively have a transmission mode and an image-display mode.

As such, the device may have very high transmittance in the transmission mode and may display images in the image-display mode without loss of brightness due to the high light-blocking property. Thus, the brightness of the images may be improved.

Figure 6:
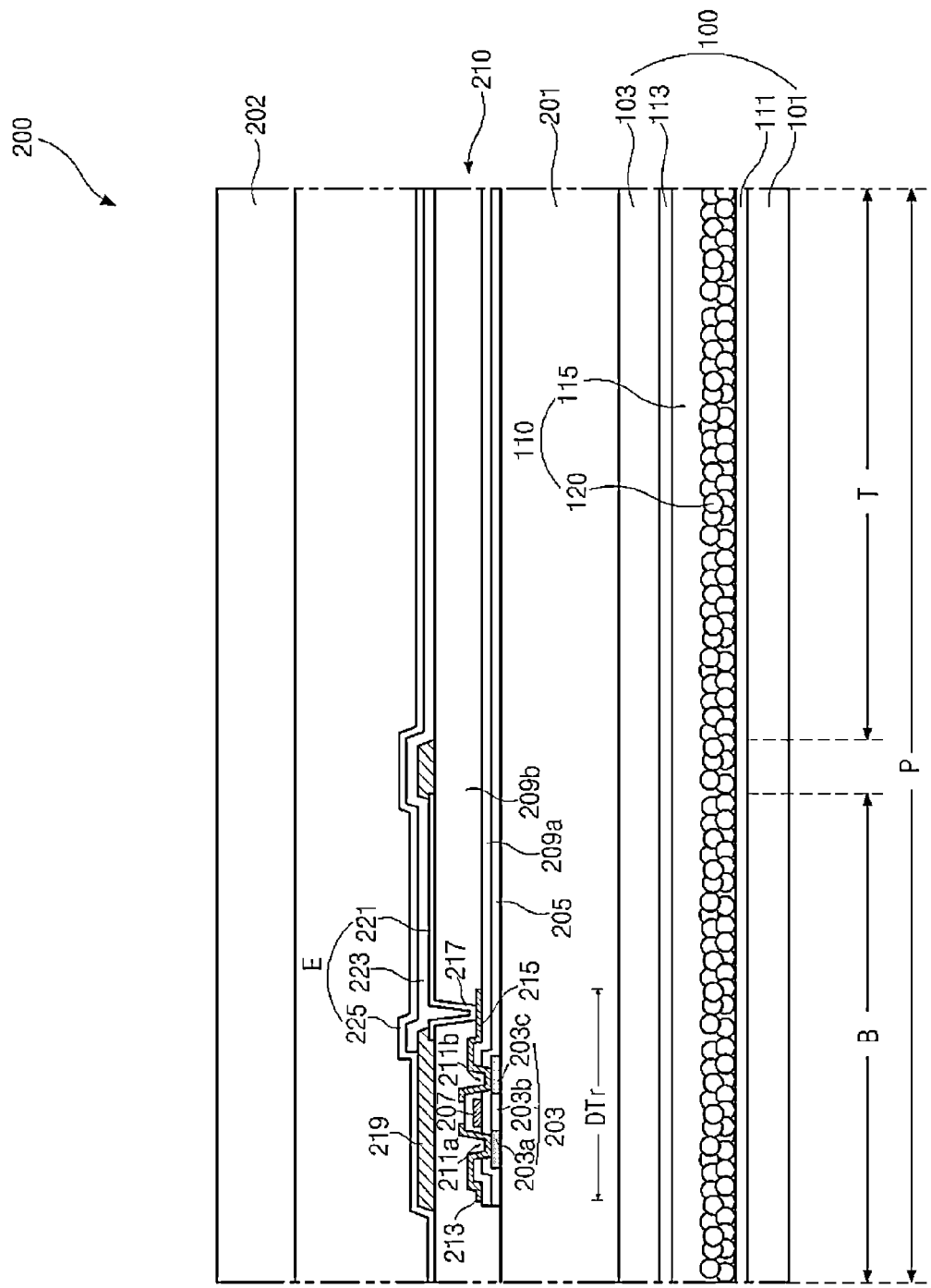
FIG. 6 is a cross-sectional view of a transparent display device according to an embodiment.

FIG. 6 is a cross-sectional view of a transparent display device according to an embodiment.

In FIG. 6, the transparent display device 200 according to an embodiment may include a display panel unit 210 and a variable blocking film 100. The display panel unit 210 may include an organic light-emitting diode (OLED) device, which may have wide viewing angles, a high contrast ratio, and low power consumption, may be driven by low direct current voltages, and may have a fast response time.

The OLED device may be classified as a top-emission type or a bottom-emission type. A top-emission type OLED device will be described as an example of the display panel unit 210. The display panel unit 210 may include a pixel region P including a display portion B and a transparent portion T. A driving thin film transistor DTr, a switching thin film transistor (not shown), and an organic light-emitting diode (E) may be formed in the display portion B.

For example, a first substrate 201, on which the driving thin film transistor DTr and the switching thin film transistor may be formed, and a second substrate 202 (for encapsulation) may be spaced apart from and may face each other. The first and second substrates 201 and 202 may be attached by a seal pattern along peripheries of the first and second substrates 201 and 202. Each of the first and second substrates 201 and 202 may be formed of a transparent material.

In one example, the pixel region P defined on the first substrate 201 may be divided into the display portion B and the transparent portion T. A semiconductor layer 203, e.g., of silicon, may be formed in the display portion B of the first substrate 201. The semiconductor layer 203 may include an active area 203b and source and drain areas 203a and 203c at both sides of the active area 203b. The active area 203b may function as a channel of a thin film transistor, and the source and drain areas 203a and 203c may be highly doped with impurities. The semiconductor layer 203 may be formed of polycrystalline silicon.

A gate insulating layer 205 may be formed on the semiconductor layer 203, and a gate electrode 207 and a gate line (not shown) may be formed on the gate insulating layer 205. The gate electrode 207 may correspond to the active area 203b of the semiconductor layer 203. The gate line may extend along a first direction and may be connected to the gate electrode 207.

A first inter insulating layer 209a may be formed on the gate electrode 207 and the gate line. The first inter insulating layer 209a and the gate insulating layer 205 thereunder may have first and second semiconductor contact holes 211a and 211b exposing the source and drain areas 203a and 203c, respectively.

Source and drain electrodes 213 and 215 may be formed on the first inter insulating layer 209a having the first and second semiconductor contact holes 211a and 211b. The source and drain electrodes 213 and 215 may be spaced apart from each other and may contact the source and drain areas 203a and 203c through the first and second semiconductor contact holes 211a and 211b, respectively.

A second inter insulating layer 209b may be formed on the source and drain electrodes 213 and 215 and on the first inter insulating layer 209a exposed between the source and drain electrodes 213 and 215. The second inter insulating layer 209b may have a drain contact hole 217 exposing the drain electrode 215.

The gate insulating layer 205 and the first and second inter insulating layers 209a and 209b may be formed of a transparent material transmitting light. For example, a driving thin film transistor DTr may include the source and drain electrodes 213 and 215, the semiconductor layer 203 including the source and drain areas 203a and 203c, the gate insulating layer 205 on the semiconductor layer 203, and the gate electrode 207.

Although not shown in the figure, a data line may be formed along a second direction and may cross the gate line to define the pixel region P. In addition, a switching thin film transistor having the same structure as the driving thin film transistor DTr may be formed and may be connected to the driving thin film transistor DTr.

For example, the switching thin film transistor and the driving thin film transistor DTr may have a top gate structure in which the semiconductor layer 203 may be formed of, e.g., polycrystalline silicon, and the switching thin film transistor and the driving thin film transistor DTr may have a bottom gate structure in which a semiconductor layer includes intrinsic and impurity-doped amorphous silicon.

An organic light-emitting diode E may include a first electrode 221, an organic light-emitting layer 223, and a second electrode 225 that may be sequentially formed on the second inter insulating layer 209b. The first electrode 221 may be connected to the drain electrode 215 of the driving thin film transistor DTr through the drain contact hole 217. The first electrode 221 may be formed in the display portion B of each pixel region P, and a bank 219 may be formed along edges of the display portion B of each pixel region P. The organic light-emitting layer 223 may be formed on the first electrode 221.

The organic light-emitting layer 223 may have a single-layered structure of a light-emitting material. Alternatively, the organic light-emitting layer 223 may have a multi-layered structure of a hole injecting layer, a hole transporting layer, a light-emitting material layer, an electron transporting layer, and an electron injecting layer, which may increase light-emitting efficiency.

The organic light-emitting layer 223 may be formed of an organic material emitting, for example, one of red, green, and blue and patterned light in the display portion B of each pixel region P. The organic light-emitting layers 223 emitting red, green, and blue light, respectively, may be sequentially arranged.

The second electrode 225 may be formed on the organic light-emitting layer 223. The first electrode 221 may function as a cathode electrode, and the second electrode 225 may function as an anode electrode.

The OLED device may be a top-emission type in which light from the organic light-emitting layer 223 of the organic light-emitting diode E is emitted through the second electrode 225. The light may be emitted to the outside through the second electrode 225, and the display portion B of the pixel region P of the transparent display device may display an image.

The transparent display device 200 may include the variable blocking film 100 at an opposite side to a side at which the image displayed, e.g., at a rear surface of the first substrate 201. The variable blocking film 100 may include lower and upper transparent films 101 and 103, lower and upper transparent electrodes 111 and 113, and an electrochromic layer 110. The lower and upper transparent films 101 and 113 may be spaced apart from each other. The lower and upper transparent electrodes 111 and 113 may be formed on inner surfaces of the lower and upper transparent films 101 and 103. The electrochromic layer 110 may be interposed between the lower and upper transparent electrodes 111 and 113.

The electrochromic layer 110 may include electrolyte 115 and core-shell nanoparticles 120. The core-shell nanoparticles 120 may be widely dispersed in the electrolyte 115. A color of each core-shell nanoparticle 120 may be changed by an electrical oxidation-reduction reaction according to applied voltages, and a transmissive property of the core-shell nanoparticle 120 may be altered.

Accordingly, the variable blocking film 100 may selectively transmit or block light, depending on voltages applied to the lower and upper transparent electrodes 111 and 113.

From this, the transparent display device 200 may selectively operate in a transmission mode and an image-display mode, and the visibility of the display to a viewer may be improved even if the transparent display device 200 displays images in high ambient light.

Figure 7A:
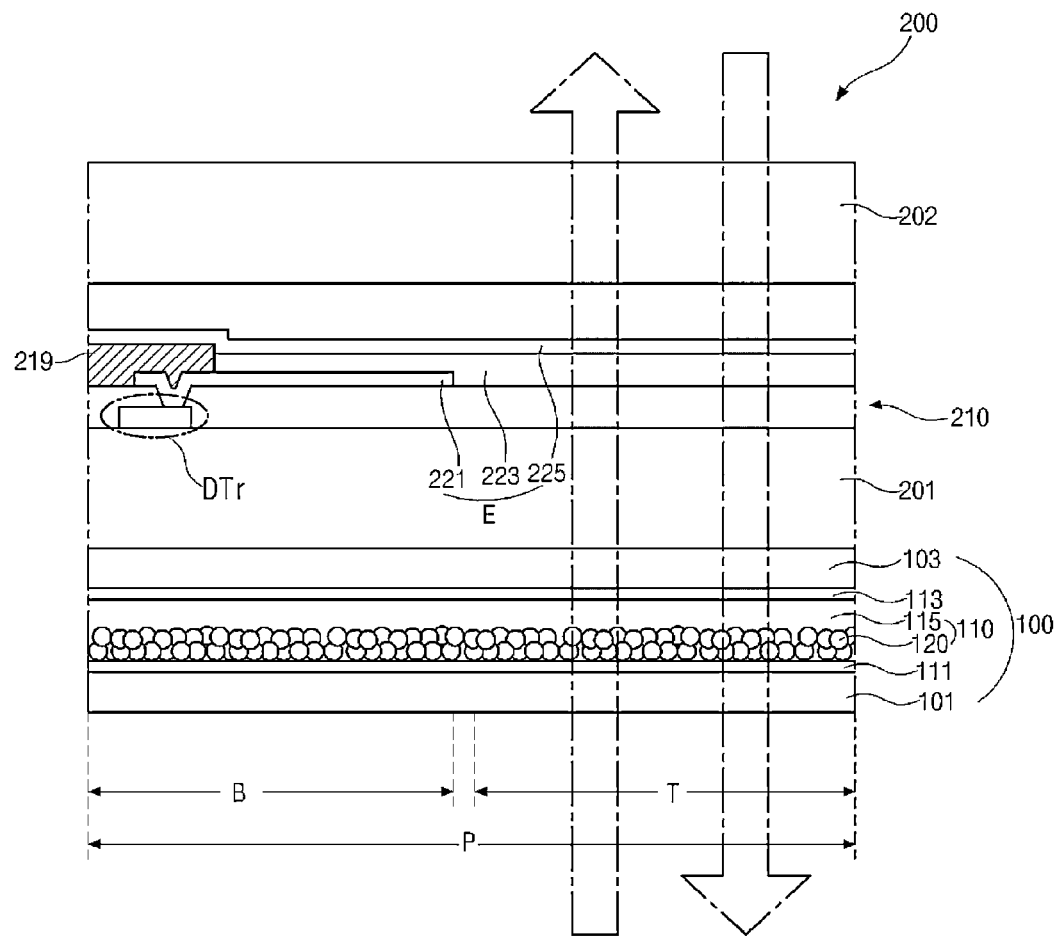
FIGS. 7A and 7B are schematic views of a transparent display device in a transmission mode and in an image-display mode by a transmissive mode and a lighttight mode of a variable blocking film according to an embodiment.
Figure 7B:
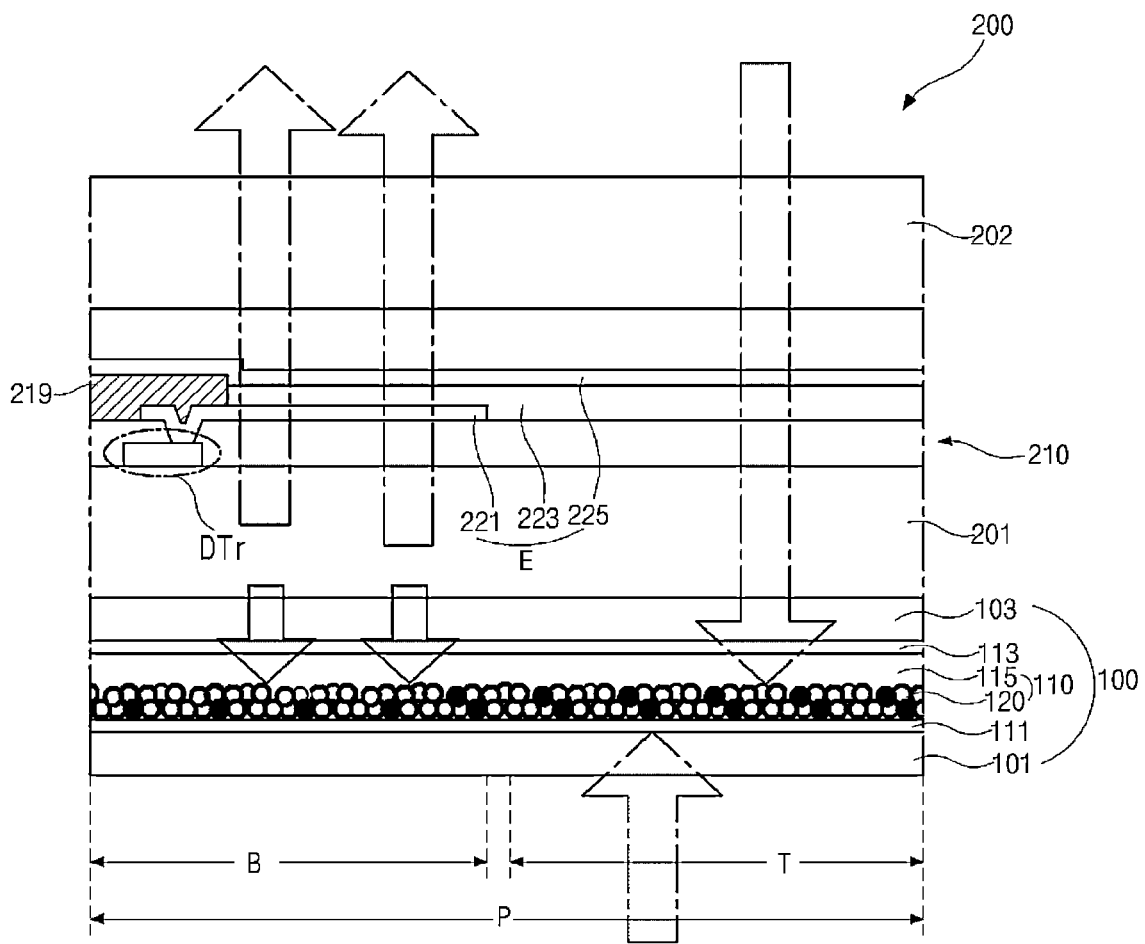

This will be described in detail with reference to FIGS. 7A and 7B. FIGS. 7A and 7B are schematic views of a transparent display device in a transmission mode and in an image-display mode, based on a transmissive mode and a lighttight mode of a variable blocking film according to an embodiment.

In FIG. 7A, when the display panel unit 210 is turned off and the display panel unit 210 does not display images, the variable blocking film 100 may also turn off and may operate in the transmissive mode in which the core-shell nanoparticle 120 of the electrochromic layer 110 of the variable blocking film 100 may be transparent. As a result, light may be transmitted in the transparent portion T, and a user may see or view an object or image opposite (through) the transparent display device 200.

In FIG. 7B, when the display panel unit 210 is turned on and the transparent display device 200 operates in the image-display mode in which an image is displayed through the display portion B, voltages may be applied to the lower and upper transparent electrodes 111 and 113 of the variable blocking film 100.

The shell 123 of FIG. 2B of each core-shell nanoparticle 120 of the electrochromic layer 110 of the variable blocking film 100 may turn black or may turn bluish green, yellow, or red. The electrochromic layer 110 may function as a light-blocking layer due to the core-shell nanoparticles 120 and may operate in the lighttight mode.

Therefore, light from the organic light-emitting layer 223 of the organic light-emitting diode E may be emitted through the second electrode 225, and an image may be displayed in the display portion B. Light facing the first electrode 221 and the variable blocking film 100 may be blocked by the core-shell nanoparticles 120 of the variable blocking film 100 which may function as a light-blocking layer.

In the transparent portion T, light incident on the rear surface of the transparent display device 200 from the outside may be blocked by the variable blocking film 100, and the user may not see the object or image opposite (through) the transparent display device 200. For example, as the object or image opposite (through) the device 200 may not be seen in the transparent portion T, the image displayed by the display panel unit 210 may be further focused, and the user may perceive that the image displayed by the display panel unit 210 is more vivid.

As stated above, the variable blocking film 100 may be disposed at the rear surface of the display panel unit 210 of the transparent display device 200, and the transparent display device 200 may selectively operate in the transmission mode and in the image-display mode. In addition, the visibility of the displayed image to the user may be improved in the image-display mode.

Figure 8:
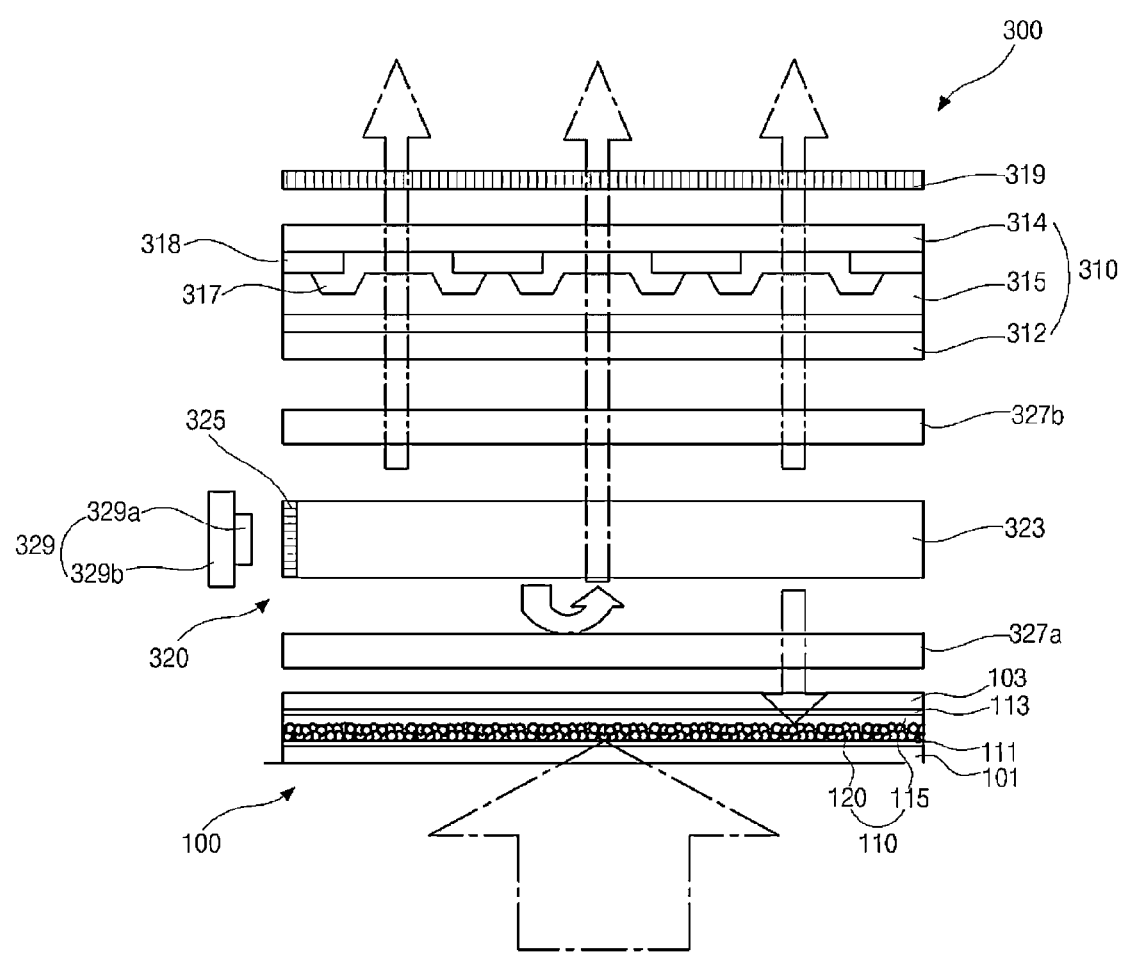
FIG. 8 is a cross-sectional view of a transparent display device according to an embodiment.

FIG. 8 is a cross-sectional view of a transparent display device according to an embodiment. The transparent display device in the FIG. 8 example may have a similar structure to the device in the FIG. 6 example. Like elements will be designated by the same reference numbers, and explanation for the same elements will be omitted or simplified.

In FIG. 8, the transparent display device according to an embodiment may include a display panel unit and a variable blocking film 100. The display panel unit may include a liquid crystal display (LCD) device, which may be driven based on optical anisotropy and polarization characteristics of a liquid crystal material and may display an image.

The LCD device may include a liquid crystal display panel 310 and a backlight unit 320. The liquid crystal display panel 310 may display an image, and the backlight unit 320 may provide light to the liquid crystal display panel 310.

The liquid crystal display panel 310 may include an array substrate 312, a color filter substrate 314, and a liquid crystal layer 315 interposed between the substrates 312 and 314. Although not shown in FIG. 8, the array substrate 312, as an active matrix type, may include gate lines and data lines crossing each other to define pixel regions, thin film transistors at respective crossing points of the gate and data lines, and transparent pixel electrodes in respective pixel regions and connected to the thin film transistors.

Each of the thin film transistors may include a gate electrode, a gate insulating layer, a semiconductor layer, a source electrode, and a drain electrode.

Each of the pixel electrodes may have a plate shape corresponding to the pixel region. A common line may be formed on the same layer as the gate line and parallel to the gate line, and a common electrode may be formed on the color filter substrate 314 and electrically connected to the common line.

Alternatively, each of the pixel electrodes may include patterns of a bar shape spaced apart from each other in the pixel region. In one example, the pixel electrode may overlap the gate line to form a storage capacitor. A common electrode may be formed in the pixel region on the array substrate 312 and may include patterns of a bar shape spaced apart from each other and alternating the patterns of the pixel electrode, or the common electrode may overlap the pixel electrode.

When the pixel electrode has a plate shape corresponding to the pixel region, the liquid crystal display panel 310 may operate in a TN (twisted nematic) mode, an ECB (electrically controlled birefringence) mode, or in a VA (vertical alignment) mode. When the pixel electrode includes patterns of a bar shape spaced apart from each other in the pixel region, the liquid crystal display panel 310 may operate in an IPS (in-plane switching) mode or an FFS (fringe field switching) mode. As an example, a TN mode liquid crystal display panel 310 will be described.

The color filter substrate 314 may include a black matrix 318 and a color filter layer 317. The black matrix 318 may have openings corresponding to the pixel regions. The color filter layer 317 may include red, green, and blue color filter patterns, which may be sequentially repeatedly arranged and may correspond to the openings, respectively. A polarizer 319 may be attached at an outer surface of the color filter substrate 314.

The backlight unit 320 may be disposed at a rear side of the liquid crystal display panel 310 and may provide light to the liquid crystal display panel 310. The backlight unit 320 may be a side-light type and may include an LED assembly 329, a light guide plate 323, and a side polarizer 325. The LED assembly 329 may be a light source, and the light guide plate 323 may guide light from the LED assembly 329. The side polarizer 325 may be disposed at a side surface of the light guide plate 323 facing the LED assembly 329, which may be referred to as a "light-incident" surface.

In addition, first and second PDLC (polymer dispersed liquid crystal) films 327a and 327b may be disposed under and over the light guide plate 323, respectively.

The LED assembly 329 may be disposed at a side of the light guide plate 323 and may face the light-incident surface of the light guide plate 323. The LED assembly 329 may include LEDs 329a and a PCB (printed circuit board) 329b on which the LEDs may be mounted and spaced apart from each other.

The side polarizer 325 at the light-incident surface of the light guide plate 323 may linearly polarize light. Light from the LEDs 329a may be linearly polarized by the side polarizer 325, and may be incident on the light guide plate 323.

To show full black of a black gray or grayscale, a transmission axis of the side polarizer 325 may be perpendicular to a transmission axis of the polarizer 319, such that linearly polarized light passing through the side polarizer 325 may be completely blocked by the polarizer 319. Light incident on the light guide plate 323 from the LEDs 329a of the LED assembly may move inside the light guide plate 323 due to several total reflections and may be spread in the light guide plate 323 to be provided to the liquid crystal display panel 310 as a surface light source.

Each of the first and second PDLC films 327a and 327b may include first and second films and a PDLC layer interposed therebetween. The PDLC layer may include polymers and dispersed liquid crystal droplets. When voltages are not applied, liquid crystal molecules of the liquid crystal droplets irregularly arranged may scatter light, and the first and second PDLC films 327a and 327b may be opaque. In response to voltages being applied, the liquid crystal molecules may be arranged in a direction, and refractive indexes of the polymers and the liquid crystal droplets may coincide. Thus, the first and second PDLC films 327a and 327b may be transparent.

For example, when the liquid crystal display panel 310 of the transparent display device 300 displays an image, the first and second PDLC films 327a and 327b, which may be in an off state, may scatter light and may have diffusion and reflection functions. For example, the second PDLC film 327b may function as a diffuser plate scattering the surface light source provided from the light guide plate 323 to the liquid crystal display panel 310. The first PDLC film 327a may serve as a reflection plate reflecting light passing through a lower surface of the light guide plate towards the liquid crystal display panel 310 and increasing brightness.

In the transparent display device 300, the variable blocking film 100 may be disposed under the first PDLC film 327a opposite to a side where an image is displayed. The variable blocking film 100 may include lower and upper transparent films 101 and 103, lower and upper transparent electrodes 111 and 113, and an electrochromic layer 110. The lower and upper transparent films 101 and 113 may be spaced apart from each other. The lower and upper transparent electrodes 111 and 113 may be formed on inner surfaces of the lower and upper transparent films 101 and 103. The electrochromic layer 110 may be interposed between the lower and upper transparent electrodes 111 and 113.

The electrochromic layer 110 may include electrolyte 115 and core-shell nanoparticles 120. The core-shell nanoparticles 120 may be widely dispersed in the electrolyte 115. A color of each core-shell nanoparticle 120 may be changed by an electrical oxidation-reduction reaction according to applied voltages, and a transmissive property of the core-shell nanoparticle 120 may be altered.

Accordingly, the variable blocking film 100 may selectively transmit or block light, depending on voltages applied to the lower and upper transparent electrodes 111 and 113. From this, the transparent display device 300 may selectively operate in a transmission mode and an image-display mode, and the visibility of an image to a viewer may be improved in the image-display mode.

That is, in the transmission mode of the transparent display device 300, the liquid crystal display panel 310, the backlight unit 320, and the variable blocking film 100 may be turned off and the first and second PDLC films 327a and 327b may be turned on. A user may see an object or image opposite (through) the transparent display device 300.

In contrast, in the image-display mode, the liquid crystal display panel 310, the backlight unit 320, and the variable blocking film 100 may be turned on and the first and second PDLC films 327a and 327b may be turned off. Light from the backlight unit 320 may be provided to the liquid crystal display panel 310, and the liquid crystal display panel 310 may display an image.

In one example, in the image-display mode, light from the backlight unit 320 may be diffused by the second PDLC film 327b and may be provided to the liquid crystal display panel 310 as a uniform surface light source. Some of the light passing through a rear surface of the backlight unit 320 may be reflected by the first PDLC film 327a towards the liquid crystal display panel 310, and other light passing through the first PDLC film 327a may be blocked by the variable blocking film 100 operating in the lighttight mode. The user may not see the object or image opposite through the transparent display device 300.

Moreover, as light incident on the rear surface of the transparent display device 300 from the outside may also be blocked by the variable blocking film 100, the image displayed by the liquid crystal display panel 310 may be further focused, and the user may perceive that the image displayed by the liquid crystal display panel 310 is more vivid.

As stated above, the variable blocking film 100 may be disposed at the rear surface of the backlight unit 320 of the transparent display device 300, and the transparent display device 300 may selectively operate in the transmission mode and in the image-display mode. In addition, the visibility of the displayed image to the user may be improved in the image-display mode.

In the transparent display device of an embodiment, the variable blocking film including the electrochromic core-shell nanoparticles may be disposed at the rear side of the display panel unit. When the transparent display device operates in the transmission mode, the variable blocking film may also operate in the transmissive mode, and the transparent display device may transmit the image or object opposite (through) the device. When the transparent display device operates in the image-display mode, the variable blocking film may operate in the lighttight mode, the transparent display device may not transmit the object or image opposite (through) the device. The transparent display device may selectively operate in the transmission mode and in the image-display mode.

In addition, in the image-display mode, the transparent display device may display high-brightness images, and the images may be more vividly displayed by the display panel unit. Moreover, as the solid electrolyte may be used as the electrolyte of the variable blocking film, the electrolyte may be prevented from leaking as compared to the liquid electrolyte, and the variable blocking film may be formed in a flexible film type.

Furthermore, electrons may actively move in the electrolyte, and the response time may be improved. Because a fixing material such as a seal pattern may be omitted, convenience in manufacturing may be improved, and the manufacturing may be simplified. The core-shell nanoparticles may have a spherical shape, and the variable blocking film may have a large specific surface area in comparison to a flat shape. Therefore, the light-blocking efficiency may be increased. The electrochromic shell may be chemically combined to the core, and the driving stability may be relatively high.

Although embodiments have been described with reference to a number of illustrative embodiments thereof, it should be understood that numerous other modifications and embodiments may be devised by those skilled in the art that will fall within the spirit and scope of the principles of this disclosure. For example, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A transparent display device, comprising:
a display panel unit comprising:
a first side configured to display an image; and
a second side opposed to the first side; and
a variable blocking film at the second side of the display panel unit, the variable blocking film comprising electrochromic core-shell nanoparticles,
wherein each of the core-shell nanoparticles comprises:
a transparent core; and
an electrochromic shell surrounding the transparent core.

2. The device of claim 1, wherein:
the variable blocking film operates in a transmissive mode when the electrochromic shell is transparent; and
the variable blocking film operates in a lighttight mode when the electrochromic shell is black.

3. The device of claim 1, wherein:
each electrochromic shell shows black by a mixture of green, red, and blue in the electrochromic shell; or
a plurality of the electrochromic shells show black by a mixture of green, red, and blue electrochromic shells.

4. The device of claim 1, wherein the variable blocking film comprises:
lower and upper transparent films facing each other;
lower and upper transparent electrodes at inner surfaces of the lower and upper transparent films, respectively; and
an electrochromic film comprising the core-shell nanoparticles and an electrolyte.

5. The device of claim 4, wherein the electrolyte comprises:
a solid type; or
a semisolid of a gel type.

6. The device of claim 1, wherein the transparent core comprises a conductive property.

7. The device of claim 1, wherein the display panel unit comprises an organic light-emitting diode (OLED) device, comprising a pixel region, the pixel region comprising:
a transparent portion; and
a display portion.

8. The device of claim 1, wherein the display panel unit comprises:
a liquid crystal display panel; and
a backlight unit.

9. The device of claim 8, wherein:
a polarizer comprising a first transmission axis is disposed over the liquid crystal panel at the first side of the display panel unit;
first and second polymer dispersed liquid crystal films are disposed under and over a light guide plate of the backlight unit;
a side polarizer having a second transmission axis is disposed between the light guide plate and an LED assembly of the backlight unit; and
the first transmission axis is perpendicular to the second transmission axis, such that linearly polarized light passing through the side polarizer is completely blocked by the polarizer.

10. A method of manufacturing a transparent display device, comprising:
providing a display panel unit comprising:
a first side configured to display an image; and
a second side opposed to the first side; and
providing a variable blocking film at the second side of the display panel unit, the variable blocking film comprising electrochromic core-shell nanoparticles,
wherein providing each of the core-shell nanoparticles comprises:
providing a transparent core; and
providing an electrochromic shell surrounding the transparent core.

11. The method of claim 10, wherein:
the variable blocking film operates in a transmissive mode when the electrochromic shell is transparent; and
the variable blocking film operates in a lighttight mode when the electrochromic shell is black.

12. The method of claim 10, wherein:
each electrochromic shell shows black by a mixture of green, red, and blue in the electrochromic shell; or
a plurality of the electrochromic shells show black by a mixture of green, red, and blue electrochromic shells.

13. The method of claim 10, wherein providing the variable blocking film comprises:
  providing lower and upper transparent films facing each other;
  providing lower and upper transparent electrodes at inner surfaces of the lower and upper transparent films, respectively; and
  providing an electrochromic film comprising the core-shell nanoparticles and an electrolyte.

14. The method of claim 13, wherein providing the electrolyte comprises:
  providing a solid type; or
  providing a semisolid of a gel type.

15. The method of claim 10, wherein the transparent core comprises a conductive property.

16. The method of claim 10, wherein providing the display panel unit comprises providing an organic light-emitting diode device, comprising a pixel region, the pixel region comprising:
  a transparent portion; and
  a display portion.

17. The method of claim 10, wherein providing the display panel unit comprises:
  providing a liquid crystal display panel; and
  providing a backlight unit.

18. The method of claim 17, wherein:
  a polarizer comprising a first transmission axis is disposed over the liquid crystal panel at the first side of the display panel unit;
  first and second polymer dispersed liquid crystal films are disposed under and over a light guide plate of the backlight unit;
  a side polarizer having a second transmission axis is disposed between the light guide plate and an LED assembly of the backlight unit; and
  the first transmission axis is perpendicular to the second transmission axis, such that linearly polarized light passing through the side polarizer is completely blocked by the polarizer.

* * * * *